United States Patent [19]
Fujikawa et al.

[11] 3,911,468
[45] Oct. 7, 1975

[54] MAGNETIC-TO-ELECTRIC CONVERSION SEMICONDUCTOR DEVICE

[76] Inventors: Kyoichiro Fujikawa; Saburo Takamiya, both of Itami, Hyogo, Japan

[22] Filed: Oct. 16, 1973

[21] Appl. No.: 406,807

Related U.S. Application Data

[63] Continuation-in-part of Ser. No. 144,513, May 18, 1971, abandoned.

[30] Foreign Application Priority Data

May 22, 1970 Japan .............................. 45-43868
June 26, 1970 Japan .............................. 45-55803

[52] U.S. Cl. .................... 357/27; 307/309; 357/20; 357/46

[51] Int. Cl.$^{2}$.................... H01L 29/82; H01L 27/22

[58] Field of Search .... 317/235 H, 234 Q; 307/309; 357/20, 27, 46

[56] References Cited

UNITED STATES PATENTS

| | | | |
|---|---|---|---|
| 3,482,150 | 12/1969 | Wolfrum et al. | 357/20 |
| 3,519,899 | 7/1970 | Yamada | 307/309 |
| 3,668,439 | 6/1972 | Fujikawa et al. | 357/27 |
| 3,731,123 | 5/1973 | Matsushita | 307/309 |
| 3,811,075 | 5/1974 | Shiga | 357/46 |

FOREIGN PATENTS OR APPLICATIONS

| | | | |
|---|---|---|---|
| 805,926 | 12/1958 | United Kingdom | 307/309 |

OTHER PUBLICATIONS

Bose, "Effect of Magnetic Field on Point Contact Transistors," *Electronic Engineering*, Nov. 1958, pp. 639–641.

*Primary Examiner*—William D. Larkins
*Attorney, Agent, or Firm*—Robert E. Burns; Emmanuel J. Lobato; Bruce L. Adams

[57] ABSTRACT

The disclosed magnetic-to-electric conversion semiconductor device comprises a base region surrounded by a collector region and having an emitter and a base electrode. The transportation coefficient of the carriers injected from the emitter to flow through the base region toward the base electrode is variable in accordance with the direction of the applied magnetic field, thereby to vary the number of the carriers that reach the base electrode.

14 Claims, 18 Drawing Figures

MAGNETIC-TO-ELECTRIC CONVERSION SEMICONDUCTOR DEVICE

This application is a continuation-in-part of application Ser. No. 144,513 filed May 18, 1971, now abandoned.

BACKGROUND OF THE INVENTION

1. Field of the Invention

This invention relates to a magnetic-to-electric conversion semiconductor device for converting the variation in strength and direction of a magnetic field into the variation in an electrical signal.

2. Description of the Prior Art

Semiconductor devices of the type utilizing a combination region for providing an electrical signal that varies in accordance with the variation in direction of the applied magnetic field are known. The recombination region is formed by diffusing heavy metal such as gold, cooper, iron or the like into the semiconductive material or by sand-blasting the surface of the semiconductive material. The recombination region, which serves to increase or absorb, depending upon the direction of the applied magnetic field, the carriers flowing through the semiconductor region when the flow path of the carriers is deflected due to the Lorentz's force, produces an electrical signal which varies in accordance with the direction of the magnetic field.

One example of the conventional magnetic-to-electric conversion semiconductor device employing a recombination region of the above-described type is illustrated in FIGS. 1, 2*a* and 2*b*.

A semiconductor wafer generally designated by the reference numeral 10 in the form of a rectangular wafer comprises a central region 11 of comparatively large volume and end regions 12 and 13 junctioned to the respective ends of the central region 11. The central region 11 is provided on one of the longer sides with a recombination region 14 and is made of a semiconductive material of relatively low impurity concentration, for example, equal to or less than $10^{14}$ atoms/cm$^3$. The end region 12 is made of P type semiconductive material of an impurity concentration higher than that of the central region 11, and the end region 13 is made of an N type semiconductive material of an impurity concentration higher than that of the central region 11. The recombination region 14 is formed either by diffusing one of the previously mentioned heavy metals into the semiconductive material which will become the central region 11 or by sand-blasting the semiconductive material. To the outer surface of each of the end regions 12 and 13, electrodes 15 and 16 are affixed in ohmic contact. A d.c. current source 17 is connected through a load resistance 18 across the electrodes 12 and 13 so that the electrode 15 is positive.

In FIG. 1, it is assumed that a magnetic field is applied to the semiconductor wafer 10 along a line L in the direction of the thickness of the wafer 10 and that the direction of the magnetic field changes along arrows 19 and 20. In FIGS. 2*a* and 2*b*, the arrow 19 which is represented by the "double circle" shows that the magnetic field is applied from the rear to the front of the plane of the Figure, and the arrow 20 which is represented by the "cross within circle" shows that the magnetic field is applied from the front to the rear of the plane of the Figure.

When the magnetic field directed as shown by the "double circle" 19 in FIG. 2*a* is applied to the semiconductor wafer 10, the flow of the holes injected from the end region 12 into the central region 11 is deflected toward the recombination region 14 due to the Lorentz's force as illustrated by curved arrows 21 which are shown as being bundled by an ellipse. Under these circumstances, the recombination region 14 serves to cause some of the holes injected from the end region 12 to recombine. With a stronger magnetic field, the holes that flow toward the recombination region 14 increase in number, causing a greater number of holes to recombine within the recombination region 14. As a result, the number of holes that reach the end region 13 decreases and, therefore, the electrical resistance between the electrodes 15 and 16 increases.

When the magnetic field is applied to the semiconductor wafer 10 in the direction shown by the cross within circle 20 in FIG. 2*b*, the flow of holes injected from the end region 12 to flow through the central region 11 is deflected away from the recombination region 14 due to the Lorentz's force as illustrated by curved arrows 22 illustrated as being bundled by an ellipse. In this case, the recombination region 14 serves to produce holes. With a stronger magnetic field, the recombination region 14 produces more holes. As a result, the number of holes that reach the end region 13 increases and the electrical resistance between the electrodes 15 and 16 decreases.

As is well known, the recombination region 14 is difficult to form. Especially when the recombination region is to be prepared by diffusing heavy metal atoms into the semiconductive material, it is difficult to diffuse the heavy metal atoms only into a certain selected portion of the semiconductor material. In other words, the heavy metal atoms are difficult to diffuse selectively into the semiconductor. Also in the case of application of the sand-blasting technique to the semiconductor material, it is not easy to form the recombination region. The difficulties in forming the recombination region are especially troublesome when the semiconductor device is to be mass-produced. These difficulties will be easily understood considering that the diffusion of heavy metal atoms and the sand-blasting operation must be carried out one by one on each semiconductor device.

SUMMARY OF THE INVENTION

Accordingly, one object of the presentation is to provide a new and improved magnetic-to-electric conversion semiconductor device capable of varying an electrical signal in accordance with the direction of the magnetic field without utilizing the recombination region which is difficult to form.

The invention accomplishes the above object by the provision of a magnetic-to-electric conversion semiconductor device comprising at least one transistor structure including a collector region of a semiconductive material of a first semiconductivity type, a base region of a semiconductive material of a second semiconductivity type disposed on said collector region to form a PN junction therebetween, an emitter region disposed in a predetermined position on said base region to for a PN junction therebetween for injecting carriers into the base region, a base electrode disposed on the base region and spaced apart from the emitter region, and a collector electrode disposed on the collector region. Bias means are also provided for applying a first bias potential between the emitter region and the base electrode and a second bias potential between the emitter region and the collector electrode to inject carriers from the emitter region into the base region. The transistor structure is configured such that both the transit time for which the carriers injected from the emitter region into the base region flow therethrough to reach the collector region and the transit time for which the carriers injected from the emitter region into the base region flow therethrough to reach the base electrode are substantially equal and less than the recombination lifetime in the base region of carriers injected therein. Thus the flow of carriers through the base region toward the collector region varies in coefficient of transportation in accordance with the direction of an applied magnetic field to accordingly vary the number of carriers that reach the base electrode.

The magnetic-to-electric conversion semiconductor device may include a semiconductor substrate having first and second main surfaces lying in opposed substantially parallel relationship to one another, wherein the collector region defines said first main surface and the base region defines at least almost the entire surface of the second main surface. Means connecting the collector electrode to the collector region on the first main surface in an ohmic contact relationship may be provided and the emitter region and the base electrode may be disposed on the second main surface with means connecting the base electrode in ohmic contact relationship to the base region.

The magnetic-to-electric conversion semiconductor device may further comprise a plurality of transistor structure units all having a common collector region and having independent base regions, emitter regions, and base electrodes and wherein the bias means may comprise means for supplying a bias potential between the emitter region and the base electrode of the respective units and between the emitter region and the collector electrode of the respective units. Further, the device may be orientated so that the applied magnetic field is substantially parallel to each of the main surfaces and have a component intersecting at substantially right angles with a line along which the emitter region and the base electrode oppose each other. The emitter region may include a region of the first semiconductivity type inserted from the second main surface into the base region and the base region may be provided at that side of the second main surface with an auxiliary region of the second semiconductivity type including a high concentration impurity with base electrode junctioned to the auxiliary region.

The base electrode may be provided with a signal output terminal and the collector electrode may be provided with a signal output terminal.

In another embodiment the device may comprises a plurality of transistor structure units including a common collector region of a first semiconductivity type, independent base regions of a second semiconductivity type disposed on said collector region to form PN junctions therebetween, independent emitter regions each disposed on one of said base regions to form a PN junction therebetween for injecting carriers into each base region, base electrodes each disposed on one of the base regions in spaced-apart relationship from each of the emitter regions, and a collector electrode disposed on the collector region; and bias means for applying a bias potential between the emitter region and the base electrode of the respective units and a bias potential between the emitter region and the collector electrode of the respective units to inject carriers from the emitter region into the base region of the respective units; and wherein each of the transistor structure units is configured such that the transit time for which carriers injected from the emitter region into the base region flow therethrough and reach the collector region is substantially equal to the transit time for which carriers injected from the emitter region into the base region flow therethrough and reach the base electrode; whereby the flow of carriers through the base region toward said collector region varies in coefficient of transportation in accordance with the direction of an applied magnetic field to accordingly vary the number of carriers that reach the base electrode.

The above device may include means connecting the two units in such a relationship that an electrical potential on a common signal output terminal is variable and the recombination lifetime in the base region of carriers injected from the emitter region into the base region may be greater than both of the transit times. In a further embodiment the magnetic-to-electric semiconductor transducer device may comprise a semiconductor body having a collector region of a first conductivity type, a base region of a second conductivity type contiguous with a portion of the collector region, and an emitter region of the first conductivity type contiguous with a portion of the base region and separated from the collector region by the base region; a base electrode ohmically connected to the base region; a collector electrode ohmically connected to the collector region; biasing means for forwardly biasing the emitter-base junction and reversely biasing the collector-base junction during use of the device to inject charge carriers from the emitter region into the base region afterwhich some of the charge carriers flow through the base region to the base electrode and others flow through the base region across the collector-base junction and then through the collector region to the collector electrode. The semiconductor body is configured such that the base electrode is space apart from the emitter region a distance suitably selected in relation to the dimensions of the semiconductor body so that both the transit time for which charge carriers injected from the emitter region into the base region flow therethrough to reach the collector region and the transit time for which charge carriers injected from the emitter region into the base region flow therethrough to reach the base electrode are substantially equal to each other and less than the recombination lifetime in the base region of charge carriers injected from the emitter region into the base region, whereby the coefficient of transportation of the charge carriers flowing to the collector region varies in accordance with the strength of a magnetic field applied to the semiconductor body to accordingly vary the number of charge carriers flowing to the base electrode; and means responsive to the number of charge carriers reaching the base and collector electrodes for providing an electrical signal representative of the strength of the applied magnetic field. The semiconductor body of this device may include an auxiliary region interposed between the base region and the base electrode and having the second conductivity type including therein a high concentration impurity and the collector region may have a recess therein, wherein the base region lies within the recess and is contiguous with the collector region at all surfaces thereof except for one exposed surface, and wherein both the emitter region and the base electrode are contiguous with the exposed surface.

BRIEF DESCRIPTION OF THE DRAWINGS

The invention will become more readily apparent from the following detailed description taken in conjunction with the accompanying drawings in which.

Throughout the several Figures the same reference characters designate identical or corresponding components.

DESCRIPTION OF THE PREFERRED EMBODIMENTS

Figure 1:
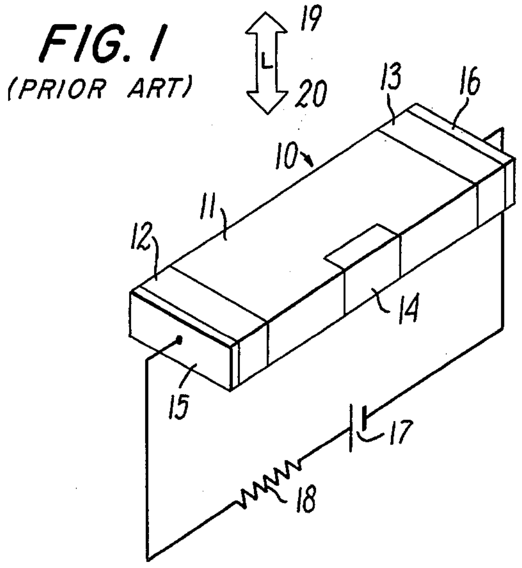
FIG. 1 (PRIOR ART)
FIG. 1 is a perspective view showing the conventional magnetic-to-electric conversion semiconductor device.
Figure 2A:
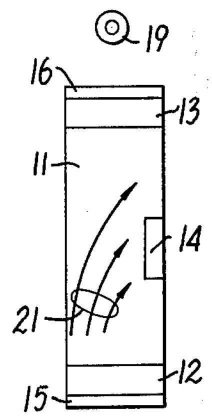
FIG. 2a (PRIOR ART)
FIG. 2*a* and 2*b* are plan views for explaining the operation of the magnetic-to-electric conversion semiconductor device illustrated in FIG. 1.
Figure 2B:
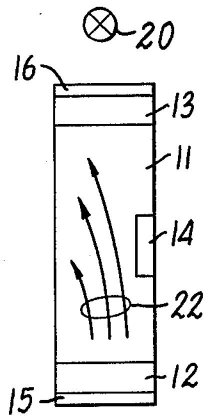
FIG. 2b (PRIOR ART)
Figure 3:
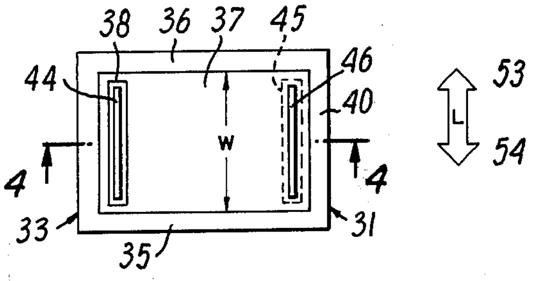
FIG. 3 is a plan view showing one embodiment of the semiconductor structure of the magnetic-to-electric conversion semiconductor device constructed in accordance with the present invention.
Figure 4:
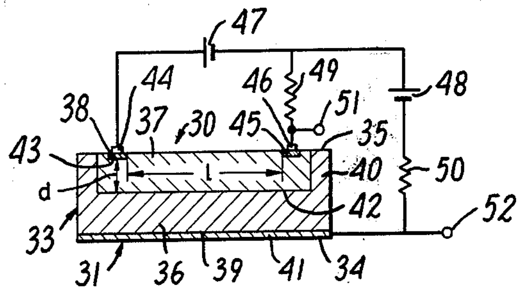
FIG. 4 is a view showing a section taken along the line IV—IV of FIG. 3 as well as an external circuit connected thereto.

FIGS. 3 and 4 illustrate a first embodiment 30 of the invention, which comprises a semiconductor structure 31 and an external circuit 32 connected thereto. The semiconductor structure 31 is shown in plan view in FIG. 3 and in section taken along the line IV—IV of FIG. 3 in FIG. 4. The semiconductor structure 31 has a semiconductor wafer 33 prepared from a rectangular sheet of semiconductor material such as silicon, germanium or the compounds of III–V groups. The semiconductor wafer 33 has a transistor structure between two main surfaces 34 and 35 substantially parallel to each other. The transistor structure is composed of a collector region 36, a base region 37 and an emitter region 38. The collector region 36 includes a bottom plate portion 39 and a peripheral wall portion 40 extending upwardly from the peripheral edge of the bottom plate portion 39. The bottom plate portion 39 defines at its bottom face the main surface 34, while the peripheral wall portion 40 defines the periphery of the main surface 35. The collector region 36 may be a P type semiconductor region having an impurity concentration of the order of $10^{18}$ atoms/cm $^3$. The main surface 34 is provided at its entire surface with a collector electrode 41 which is in an ohmic contact relationship with the collector region 36.

The base region 37 is disposed to fill the space defined by the upper face of the bottom plate portion 39 and the inner surface of the peripheral wall portion 40. The upper surface of the base region 37 forms the central surface of the main surface 35 of the semiconductor wafer 30. The base region 37 may be formed as an N type semiconductor region having an impurity concentration lower than that of the collector region 36, for example, of the order of $10^{15}$ atoms/cm$^3$.

The bottom plate portion 39 is prepared as a substrate and, in the first step of manufacturing, an N type layer which becomes the base region 37 is formed by epitaxial growth on the entire surface of the upper portion of the substrate or the bottom plate portion 39. In the second step of manufacturing, P type impurities are selectively diffused into the periphery of the base region 37 formed in the first step of manufacturing or that portion of the N type layer which becomes the peripheral wall portion 40 of the collector region 36. Thus the base region 37 and the peripheral wall portion 40 are formed to provide a P-N junction 42 between the collector region 36 and the base region 37.

As shown in FIG. 3, the base region 37 is rectangular in plan view. The width of the base region is expressed by W.

In the Figures, it is seen that an emitter region 38 is disposed on one side of the base region 37 and exposed on the main surface 35. As seen from FIG. 3, the emitter region 38 is arranged to extend across the width of the semiconductor wafer 30. The distance between the bottom face of the emitter region 38 and the upper surface of the bottom plate portion 39 of the collector region 36 as measured along the thickness direction of the transistor structure is expressed by a character *d*. The emitter region 38 is a P type semiconductor region having an impurity concentration of the order of $10^{20}$ atoms/cm$^3$ and forms a P-N junction 43 between the same and the base region 37. Onto the main surface 35, there is affixed an emitter electrode 44 in ohmic contact with the emitter region 38.

The emitter region 38 may be formed by the selective-diffusion of P type impurities into the N type base region 37. Instead of selective-diffusion, this region may be formed by the alloying method. Alternatively, if the Schottky barrier is utilized, the emitter region 38 may be omitted. In the last case, a suitable metal such as gold, aluminium or the like is attached to the main surface 35 to directly form a rectifying junction (P-N junction) between the same and the base region 37 owing to the Schottky barrier, without the emitter region 38. The metal attached to the main surface 35 is also used as the emitter electrode 44.

At the other end of the upper surface of the base region 37, there is disposed an auxiliary region 45 having a high N type impurity concentration. The region 45 is parallel to the emitter region 38 extending across the width of the semiconductor wafer 33 and exposed on the main surface 35.

The auxiliary region 45 is formed by selective-diffusion of an N type impurity of high concentration from the main surface 35 of the base region 37. A base electrode 46 fixed to the main surface 35 is connected in ohmic contact with the auxiliary region 45. The auxiliary region 45, which serves as a medium for establishing a desirable ohmic contact between the base region 37 and the base electrode 46, may be omitted.

The distance between the emitter region 38 and the auxiliary region 45 disposed on the surface 35 in parallel with each other is expressed by the character $l$.

The external circuit generally designated by the reference numeral 32 comprises two d.c. current sources 47 and 48 and two resistors 49 and 50. The positive terminal of the d.c. source 47 is connected directly to the emitter electrode 44, and the negative terminal thereof is connected to the base electrode 46 through the resistor 49. The d.c. source 48 is connected at its positive terminal directly to the negative side of the d.c. source 47 and its negative side to the collector electrode 41 through the resistor 50. The base electrode 46 has a first signal output terminal 51 and the collector electrode 41 has a second signal output terminal 52.

The description will now be made in terms of the operation of the magnetic-to-electric conversion semiconductor device of the present invention. The magnetic-to-electric conversion semiconductor device 30 illustrated in FIGS. 3 and 4 is placed in a magnetic field substantially parallel to the main surfaces 34 and 35 and along the line L perpendicular to the directional line along which the emitter and the base electrodes 44 and 46 are opposed. The magnetic field applied changes its direction along arrows 53 and 54.

Figure 5A:
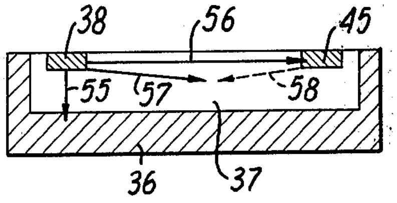
FIGS. 5*a*, 5*b* and 5*c* are sectional views for explaining the operation of the magnetic-to-electric conversion semiconductor device shown in FIGS. 3 and 4.
Figure 5B:
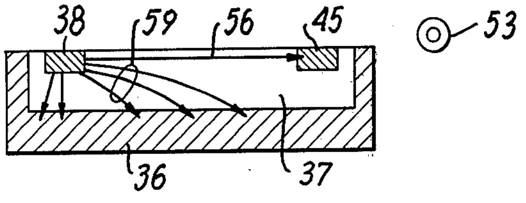
Figure 5C:
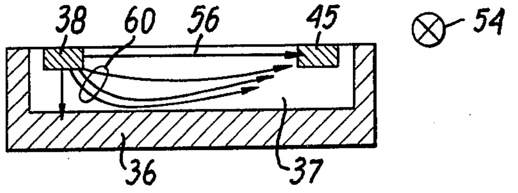

Reference should be made to FIGS. 5*a*, 5*b* and 5*c* wherein the semiconductor wafer 33 alone is shown in section with the external circuit unillustrated. The base region 37 is not hatched for clarity. FIG. 5*a* illustrates the magnetic-to-electric conversion semiconductor device with no magnetic field applied, FIG. 5*b* illustrates the device with a magnetic field in the direction of the arrow 53 applied, and FIG. 5*c* illustrates the device with a magnetic field applied in the direction of the arrow 54.

In FIG. 5*a*, where no magnetic field is applied, the holes injected from the emitter region 38 into the base region 37 owing to the voltages from the d.c. sources 47 and 48 (not shown in FIG. 5) can be considered to be divided into the following three components.

1. The component which, as shown by the arrow 55, flows through the base region 37 toward the collector region 36 due to the diffusion effect;

2. The component which, as shown by the arrow 56, flows through the base region 37 due to the drift effect and reaches the auxiliary region 45; and 3. The component which, as shown by the arrow 57, flows through the base region 37 due to the drift effect and recombines with the electrons emitted from the auxiliary region 45 as shown by a dashline 58.

Under these circumstances, the period of time during which the above first component reaches the collector region 36 from the emitter region 38, is expressed by the following equation:

$$\tau t \approx \frac{d^2}{D_P} \qquad (1)$$

where $D_P$ is the diffusion coefficient of minority carriers in the base region, which in this example is the diffusion coefficient of the holes.

The electric resistance $R_B$ of the base region 37 between the emitter region 38 and the auxiliary region 45 can be expressed by the following equation:

$$R_B = \frac{1}{q\,\mu_n\,n\,W\,d} \qquad (2)$$

where $q$ is unit electric charge ($1.60 \times 10^{-19}$ coulomb), $\mu_n$ is mobility or electrons, and $n$ is density of electrons.

By properly selecting the variables $n$, $W$, $l$ and $d$ of the equation (2), the semiconductor transducer can be so arranged that almost all of the voltage $V_{EB}$ applied across the emitter region 38 and the auxiliary region 45 is applied to the base region 37. Under these circumstances, the transit time $\tau_B$ during which the second component of the holes shown by the arrow 56 which flows from the emitter region 38 to the auxiliary region 45 can be expressed by $$\tau_B \approx \frac{l^2}{\mu_p\,V_{EB}} \qquad (3)$$

where $\mu_p$ is the mobility of minority carriers in the base region, which in this example is the mobility of holes.

If the allowable electrical power is P, then the voltage $V_{EB}$ applied across the emitter region 38 and the auxiliary region 45 is expressed by the following equation:

$$V_{EB} = P\,R_B \qquad (4)$$

The recombination lifetime is defined as the time period during which the excessive number of minority carriers decreases to be equal to $e$—1 in a semiconductor device including the excessive number of minority carriers greater than the concentration of the minority carriers in the terminal equilbrium state. The time period during which the holes injected from the emitter region 38 into the base region 37 recombine with electrons, i.e. the recombination lifetime of the holes is expressed by $\tau r$, and the amount of the third component of the holes as previously explained decreases in inverse proportion to the above recombination lifetime $\tau_r$, and becomes nearly zero as the recombination lifetime $\tau r$ becomes long.

The transit time for carriers injected from the emitter region 38 into the base region to flow therethrough and reach the collector region is expressed as $\tau_t$. For simplicity of analysis, the three dimensional mathematical treatment of the carrier flow is being viewed in one dimension and thus $\tau_t$ and $\tau_b$ are both average times and mean times and are thus called transit times as has been accepted in the art and described in the *IEEE TRANSACTIONS ON ELECTRON DEVICES* Vol. ED-14, No. 5, May 1967, pp. 233–238 and *INTRODUCTION TO*

*INTEGRATED SEMICONDUCTOR CIRCUITS* by Alvin B. Phillips, Mc Graw Hill, 1962 pp. 186–196.

It is to be understood that, in order to operate the device effectively, because the second component 56 of the holes is controlled by the magnetic field as will be described later, the magnetic-to-electric semiconductor converter device 30 should have the following relationship between the times $\tau t$, $\tau_B$, $\tau r$:

$$\tau t = .\tau B < \tau r \quad (5)$$

The conditions satisfied by equation 5 are determined in order to sufficiently present first and second components of the carriers injected from the emitter region 38 that reach the collector and base regions 36 and 37 respectively under the condition that the external magnetic field is zero. In other words, this is the condition for preventing the phenomenon from taking place in which one of the two carrier components increases to an extreme and the other component decreases to the opposite extreme. The The equation 5 is derived by the determination of lower effeciencies when the above equation 5 is not satisfied as follows:

If $\tau_t << \tau_B$ then a small $\tau_t$ implies that the carriers injected from the emitter region into the base region can reach the collector region easily, and thus it is difficult for the carriers to reach the base electrode. This condition takes place when the base layer is decreased to an extreme.

This condition, which improves gain and response speed of a transistor, is advantageously used in an ordinary transistor. However this condition is not preferable in an element in which an emitter-base diode is used as a magnetic element for which the resistivity thereof varies depending upon applied magnetic field and in which a collector region is used as an absorption region of the deflected carriers. With this condition, not only do most of the carriers injected into the base region flow into the collector, but also the deflection angle required for the flow of the carriers into the base electrode becomes large. Thus the carriers do not flow into the base electrode unless a massive external magnetic field is applied. This results in a decrease in efficiency of the magnetic-to-electric conversion element.

If $\tau_t >> \tau_B$, then it is necessary to increase the specific resistance of the base layer thereby to increase the electric field strength between the emitter electrode and the base electrode as well as to shorten the distance between the emitter electrode and the base electrode. Under this condition, most of the carriers injected into the base region reach the base electrode when the external magnetic field is zero. Since the number of the carriers flowing into the base electrode is large when the external magnetic field is zero, the variation in the base current is extremely small even when the flow component of the carriers flowing into the collector is deflected toward the base electrode. This also brings about a decrease in efficiency of a magnetic-to-electric conversion element.

When $\tau_t \approx \tau_B > \tau_r$ then $\tau_r$ is small relative to $\tau_t$ or $\tau_B$, and most of the minority carriers injected from the emitter region into the base region recombines in the base layer, becoming a base current. Therefore the component which flows into the collector becomes very small. The majority carriers within the base layer are not affected by any external magnetic field and never flow into the collector region. Therefore, if $\tau_t \approx \tau_B > \tau_r$ is satisfied, the component which varies depending upon the magnetic field becomes minute, resulting in a low effeciency.

To fullfill the equation (5), since the recombination lifetime $\tau_r$ is long enough as compared with the transit time $\tau_t$, it is only necessary to select the values *d*, *W*, *l* to satisfy the relationship $\tau_t = .\tau_B$.

For example, with a wafer made of a silicon substrate exhibiting an impurity concentration in the emitter region 38 of $10^{20}$ atoms/cm$^3$, an impurity concentration in the collector region 36 of $10^{18}$ atoms/cm$^3$, and the impurity concentration in the base region 37 of $10^{15}$ atoms/cm$^3$, the above equation (5) could be fulfilled with $l = 300\ \mu$, $d = 30\ \mu$ and $W = 100\ \mu$. It is preferable to determine the values $l = 100 - 1000\ \mu$ and $d = 10 - 100\ \mu$. The value of $l$ can vary from 100 $\mu$ to 1000 $\mu$ and $d$ can vary from 10 – 100 $\mu$, with the value $W$ of ½ – 1/5 of the value $l$ within the range wherein $W$ becomes larger than $d$. After the equation (5) could be satisfied, $\tau_t = .\tau_B$ is held. Therefore the first hole 55 component flowing into the collector region 36 and the second hole component 56 flowing into the auxiliary region 45 out of the holes injected from the emitter region 38 into the base region 37 become equal in their numbers, enabling effective control of the second hole component by the magnetic field.

When a magnetic field is applied to the semiconductor wafer in the direction as illustrated in FIG. 5*b*, the holes, which were flowing from the emitter region 38 to the auxiliary region 45 due to the drift effect as the second component 56, are deflected toward the collector region 36 due to the Lorentz's force. As a result, almost all of the holes flow into the collector region 36 via the flow path shown by the curved arrows 59 shown as bundled by an ellipse. Therefore, the number of holes flowing into the auxiliary region 45 falls, and the electric resistance between the emitter electrode 44 and the base electrode 46 increases, causing the electrical potential $V_1$ on the first signal output 51 (FIG. 4) to decrease as shown by a curve 62, particularly in that region shown by the arrow 53 in FIG. 7. The degree of the decrease increases in proportion to the strength of the magnetic field. It is to be noted that, in this case, since the resistance between the emitter electrode 44 and the collector electrode 41 decreases in proportion to the strength of the magnetic field, the electrical potential on the second signal output 52 increases in proportion to the strength of the magnetic field.

When a magnetic field is applied to the semiconductor wafer 33 in the direction illustrated in FIG. 5*c*, the Lorentz's force functions to deflect the flow of the holes, which flow toward the auxiliary region 45 due to the drift effect, toward the main surface 35.

Therefore some of the holes which were flowing into the collector region 36 are maintained in the base region 37 to reach the auxiliary region 45 as shown by the arrows 60 bundled by an ellipse. As a result, the number of holes flowing into the auxiliary region 45 increases and the electrical resistance between the base electrode 46 and the emitter electrode 44 falls. The electrical potential $V_1$ at the first signal output 51 increases as seen in the curve 62, particularly within that region expressed by the arrow 54 in FIG. 7, and the degree of the increase is proportional to the strength of the magnetic field. Contrary, the electrical potential at the second signal output 52 decreases in proportion to the strength of the magnetic field.

Figures 6A, 6B, 6C, 7:
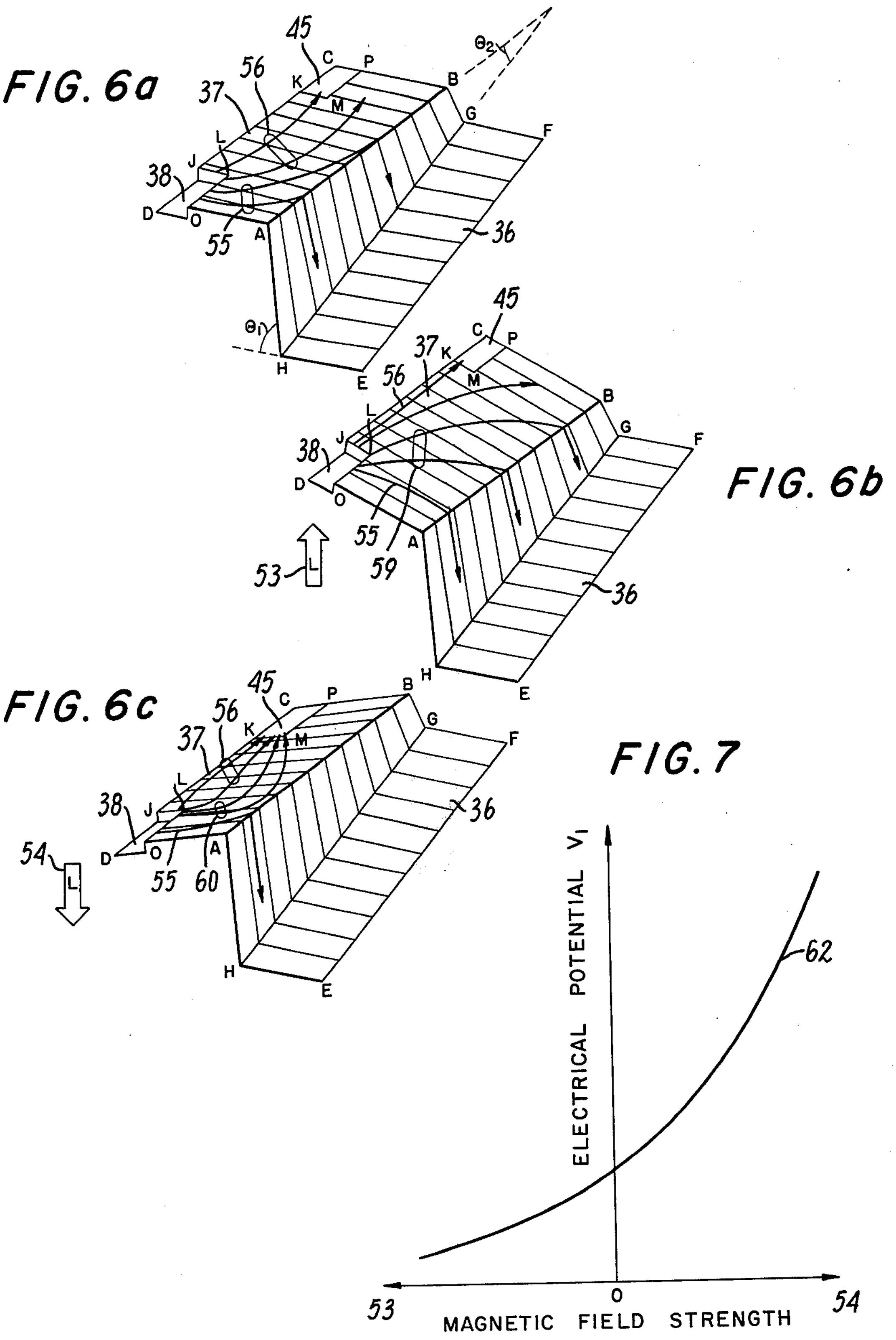
FIGS. 6*a*, 6*b* and 6*c* are energy distribution diagrams for explaining the operation of the magnetic-to-electric conversion semiconductor device shown in FIGS. 3 and 4.
FIG. 7 is a characteristic diagram of the magnetic-to-electric conversion semiconductor device illustrated in FIGS. 3 and 4.

FIGS. 6*a* to 6*c* show energy distribution diagrams which are useful in understanding the operation of the semiconductor device heretofore described. FIG. 6*a* shows the energy distribution diagram when no magnetic field is applied, FIG. 6*b* the energy distribution diagram when a magnetic field is applied in the direction of the arrow 53, and FIG. 6*c* the energy distribution diagram when a magnetic field is applied in the direction of the arrow 54. These diagrams illustrate the energy distribution at the upper end of the valence band in the interior of the wafer 33. In FIGS. 6*a* to 6*c*, the energy distribution at the collector region 36 is shown by a plane including the reference characters E,F,G, and H, and the energy level thereof is constant at any point within that plane. The energy distribution of the base region 37 is expressed by a plane JLOABPMK, and the energy distribution of the emitter region 38 is shown by a plane including the character D, which exhibits a lower energy level than that of the base region 37. The energy distribution of the auxiliary region 45 is shown by a plane including the characters C,P,M, and K and has an energy level equal to that of the base region 37. Since a high voltage is applied to the narrow region in the vicinity of the junction between the collector region 36 and the base region 37, the planes ABGH and EFGH intersect one another at an angle $\theta_1$ of approximately 90°, showing a sharp change in the energy level at that region. The energy level in the base region 37 is has down gradient from the portion neighboring the emitter region 38 toward the auxiliary region 45 as seen from a plane JCBAOL inclined by an angle $\theta_2$ with respect to the plane EFGH. This is because substantially the entire voltage applied across the emitter region 38 and the auxiliary region 45 works on the base region 37.

In FIG. 6*a*, wherein no external magnetic field is applied, the energy level in the base region 37 remains constant in the direction of the thickness of the region 37 i.e., from the main surface 35 to the main surface 34 or, in FIG. 6, in the direction of C to B.

In FIG. 6*b*, wherein a magnetic field is applied in the direction of the arrow 53, potential energy due to the Lorentz's force causes the energy level of the base region 37 to have a down slope in the said direction.

In FIG. 6*c*, wherein a magnetic field is applied in the direction of the arrow 54, potential energy produced by the Lorentz's force, of which the direction is toward the main surface 35, causes the energy level of the base region 37 to have an upward slope in the said direction.

The flow paths of the holes are shown by the arrows which correspond to and are designated by the same reference numerals as those shown in FIG. 5.

Figures 8, 9, 10:
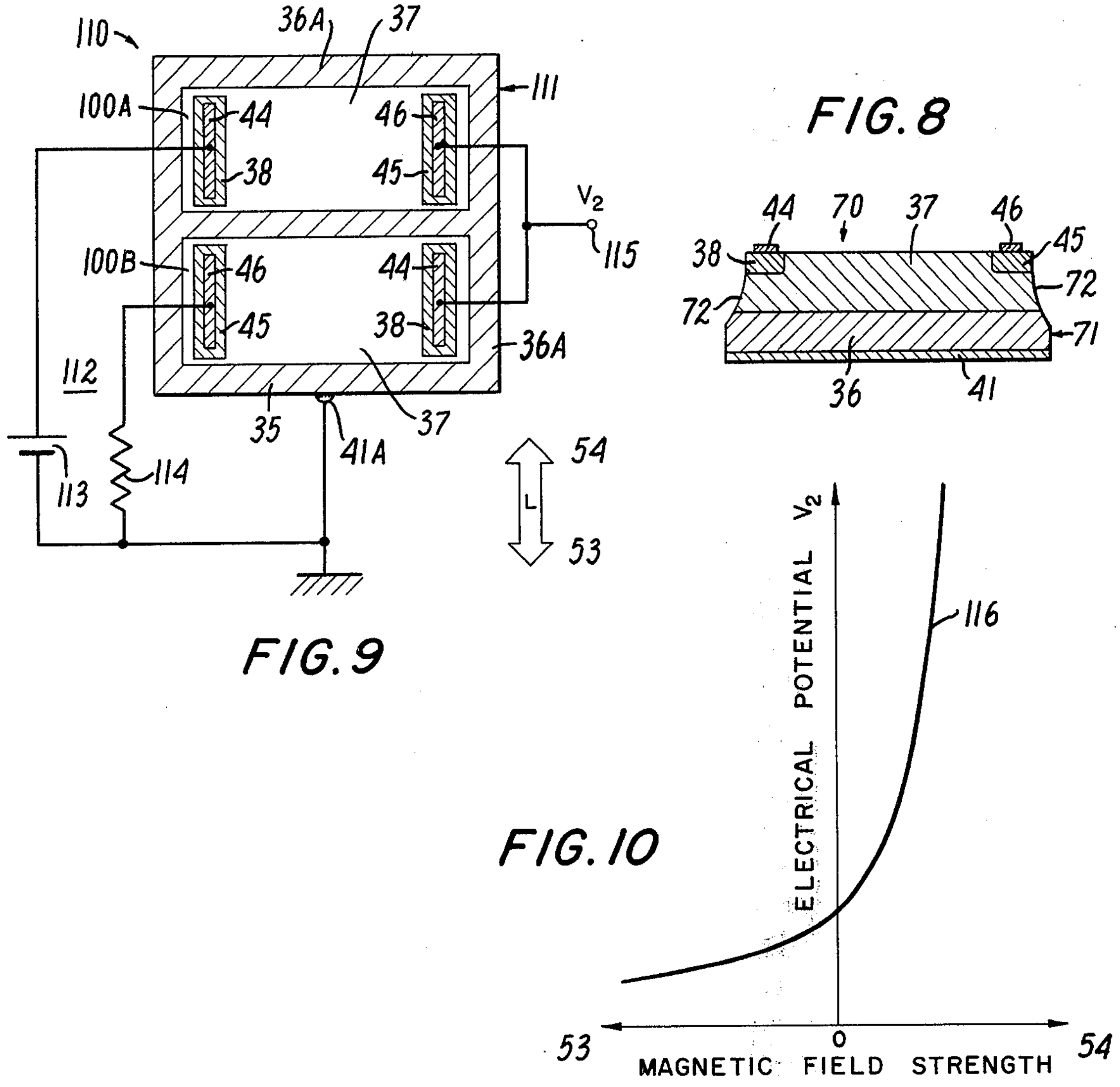
FIG. 8 is a sectional view showing another example of the semiconductor structure of the magnetic-to-electric conversion semiconductor device constructed in accordance with the present invention.
FIG. 9 is a plan view showing a modified semiconductor structure of the magnetic-to-electric conversion semiconductor device constructed in accordance with the present invention.
FIG. 10 is a characteristic diagram of the magnetic-to-electric conversion semiconductor device shown in FIG. 9.

FIG. 8 shows the semiconductor structure 71 for the magnetic-to-electric conversion semiconductor device 70. This structure is the same as the semiconductor structure 31 illustrated in FIGS. 3 and 4, except that the peripheral wall portion 40 of the device 30 is etched to form a surface 72.

It is to be noted that the devices 30 and 70 illustrated in FIGS. 3 and 4 and FIG. 8 respectively do not have a recombination region 14; consequently they can be formed by comparatively easy techniques such as epitaxial growth, diffusion, alloying formation of a Schottky barrier, or the like. The devices can be mass-produced through the utilization of the selective diffusion technique which enables the simultaneous production of the multiplicity of the structures in a single semiconductor substrate.

It is also easily understood that the semiconductor device of the same function can also be provided by changing the semiconductivity type of each region. More specifically, a P type conductivity type may be changed to an N type conductivity type, and an N type conductivity type may be changed into a P type conductivity type.

FIG. 9 illustrates semiconductor structure generally designated by the reference numeral 111 including two magnetic-to-electric conversion units 100A and 100B integrally formed within a single collector region 36A and an external circuit generally designated by the reference numeral 112. Each conversion unit 100A and 100B is identical in its structure to that illustrated in FIGS. 3 and 4 with the exception that the two units have a single common collector region 36A. Attention should be paid to the disposition of the units 100A and 100B. From the Figure it is seen that the units 100A and 100B are so disposed that their base regions 37 are brought in parallel to each other, while the emitter region of one unit is adjacent to the auxiliary region 45 of the other unit.

More specifically, as for the unit 100A, the emitter region 38 and the auxiliary region 45 are positioned at the lefthand end and the righthand end of the base region 37 respectively as viewed in the Figure. The external electric circuit generally designated by the reference numeral 112, comprises a d.c. current source 113 and a resistor 114, and a signal output 115. The positive terminal of the d.c. source 113 is connected directly to the emitter electrode 44 of the unit 100A, and the negative terminal of the d.c. source 113 is, on one hand, connected to the base electrode 46 of the unit 100B through the resistor 114 and, on the other hand, connected directly to the collector electrode 41A which is common to both the units 100A and 100B. The base electrode 46 of the unit 100A and the emitter electrode 44 of the unit 100B are connected directly to form a signal output terminal 115.

Upon the application of a reversible magnetic field along the line L substantially perpendicular to the direction along which the emitter electrode 44 and the base electrode 46 opposes and varying in its direction as illustrated by the arrows 53 and 54, the direction of the flow of holes toward the respective auxiliary region 45 due to the drift effect is in opposite directions in the two units 100A and 100B. Therefore, when the magnetic field is in the direction of the arrow 53, the flow of holes from the emitter region 38 to the auxiliary region 45 of the unit 100A is deflected toward the rear side of the plane of the Figure due to the Lorentz's force, resulting in an increase in the resistance between the emitter electrode 44 and the base electrode 46 of the unit whereas the flow of holes from the emitter region 38 to the auxiliary region 45 of the unit 100B is deflected toward the front side of the plane of the Figure resulting in a decrease in the resistance between the emitter electrode 44 and the base electrode 46 of the unit 100B. Both the variations in resistance between the emitter electrode 44 and the base electrode 46 cause, in cooperation, the electrical potential $V_2$ at the signal output terminal 115 to decrease.

When the applied magnetic field changes its direction into that shown by the arrow 54, the respective units 100A and 100B cause the resistance variation opposite to that as above described, resulting in an increase in the electric potential $V_2$ at the signal output terminal 115.

FIG. 10 shows by curve 116 the variation in the electric potential $V_2$ at the signal output terminal 115 obtained from the device 110 illustrated in FIG. 9. It is seen that the variation in the electrical potential is steeper than that shown by the curve 62 in FIG. 7. This sharp change in electrical potential is due to the combined effect of the variations in the resistances of both units 100A and 100B.

Figure 11:
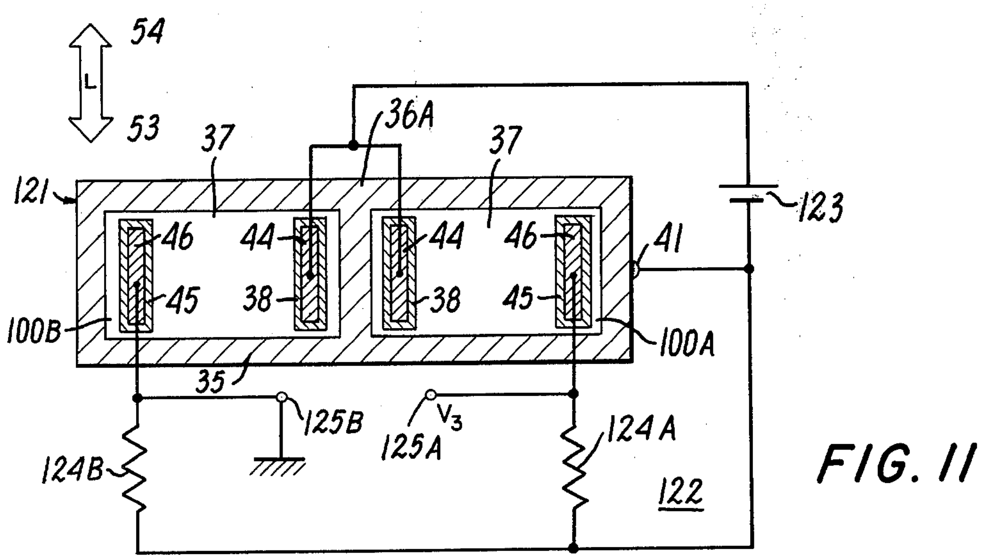
FIG. 11 is a plan view showing another modified semiconductor structure of the magnetic-to-electric conversion semiconductor device constructed in accordance with the present invention.

FIG. 11 illustrates one modification of the invention wherein a magnetic-to-electric conversion semiconductor device 120 is illustrated. The semiconductor structure 121 of the device 120 is the same as that illustrated in FIG. 9 except that the two units 100A and 100B are disposed end to end so that the emitter regions 38 of both units are adjacent and parallel. It is seen that, as is similar to the device illustrated in FIG. 9, the positions of the emitter regions 38 and the auxiliary regions 45 of the units 100A and 100B are exchanged. Therefore the emitter region 38 of the unit 100A and the emitter region 38 of the unit 100B are brought into the neighbouring relationship to each other with the common collector region 36A interposed therebetween. The external circuit 122 of the device 120 comprises a d.c. source 123, resistors 124A and 124B, and a pair of signal output terminals 125A and 125B. The positive side of the d.c. source 123 is connected to the emitter electrodes 44 of both the units 100A and 100B. The negative side of the d.c. source 123 is connected to the base electrode 46 of the unit 100A through the resistor 124A and to the base electrode 46 of the unit 100B through the resistor 124B. The output terminals 125A and 125B are connected to the base electrodes 46 of the units 100A and 100B respectively.

When a magnetic field is applied to the device in the direction of the arrow 53, the electrical resistance between the emitter electrode 44 and the base electrode 46 of the unit 100A increases, resulting in a decrease in the electric potential at the signal output terminal 125A. Contrary to the above, the electric potential at the signal output terminal of the unit 100B increases. The decrease in the electric potential at the signal output terminal 125A is similar to the variation in the direction of the arrow 53 of the curve 62 shown in FIG. 7, while the increase in the electric potential at the signal output terminal 125B is very similar to the variation in the direction of the arrow 54 of the curve 62 in the same Figure. The net output voltage $V_3$ varies as illustrated by the arrow 53 of the curve 126 in FIG. 12. This output voltage $V_3$ becomes negative at the output terminal 125A if the applied magnetic field is in the direction of the arrow 53.

Figure 12:
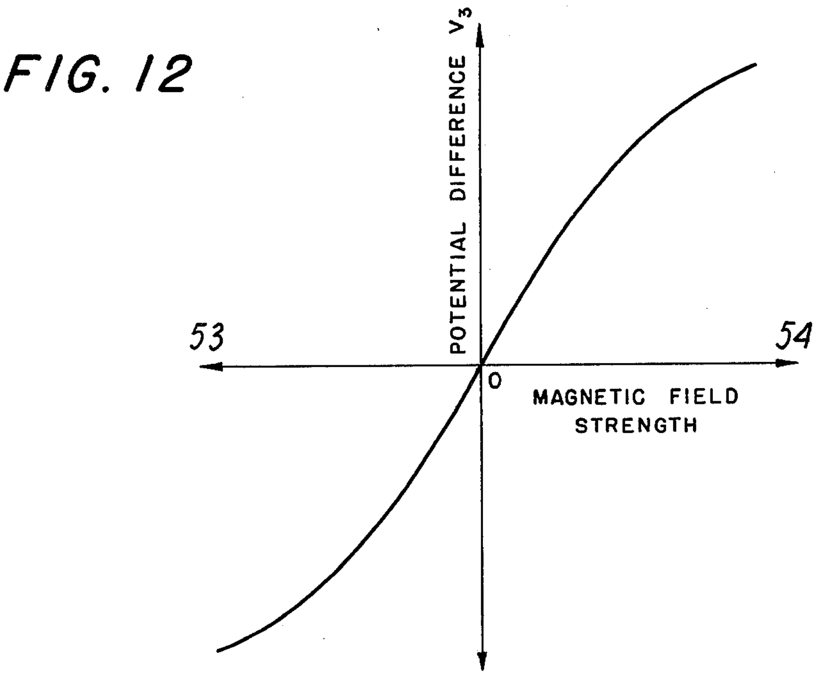
FIG. 12 is a characteristic diagram of the magnetic-to-electric conversion semiconductor device shown in FIG. 11.

If the applied magnetic field is in the direction of the arrow 54, contrary to the above, an output voltage $V_3$ positive at the output terminal 125A is provided as shown in the direction of the arrow 54 in FIG. 12. It is seen that the resultant curve 126 is substantially symmetric with respect to the point of origin.

Figure 13:
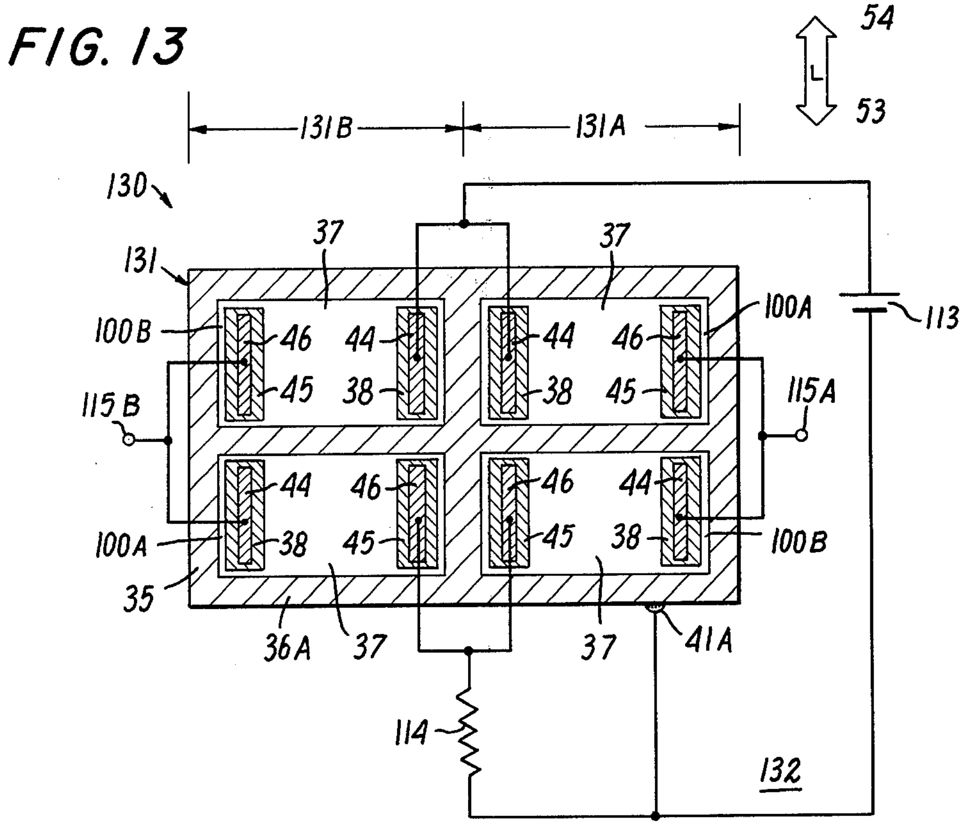
FIG. 13 is a plan view showing still another semiconductor structure of the magnetic-to-electric conversion semiconductor device constructed in accordance with the present invention.

FIG. 13 shows another modification of the present invention wherein two devices illustrated in FIG. 9 are arranged in one unit in the side-by-side relationship. The semiconductor structure 131 of the device generally designated by the reference numeral 130 is composed of two sections 131A and 131B disposed in the side-by-side relationship. The section 131A is identical to the semiconductor structure 111 illustrated in FIG. 9, and the section 131B is similar to the semiconductor structure 111 of FIG. 9 except that the positions of the emitter region 38 and the auxiliary region 45 are exchanged. The external circuit generally designated by the reference numeral 132 is similar to the external circuit 112 of the device illustrated in FIG. 9 except that the circuit has two signal output terminals 115A and 115B common to both the sections 131A and 131B.

From the signal output terminal 115A of the section 131A, a signal voltage $V_2$ identical to that shown by the curve 62 in FIG. 10 is supplied, while a signal voltage $V_2'$ shown by a curve symmetric with the curve 62 with respect to the axis of ordinate of FIG. 10 is supplied from the signal output terminal 115B of the section 131B. A difference signal between both the signals $V_2$ and $V_2'$ is similar to the curve 126 shown in FIG. 12, but of sharper variation.

It is to be noted that hatchings in FIGS. 9, 11, and 13 are applied for easy understanding of the structure of the semiconductor device, and not for indicating the cross-sections.

What we claim is:

1. A magnetic-to-electric conversion semiconductor device comprising: at least one transistor structure unit including a collector region of a first semiconductivity type, a base region of a second semiconductivity type inset in said collector region to form a PN junction therebetween, an emitter region disposed on said base region to form a PN junction therebetween for injecting carriers into the base region, a base electrode disposed on said base region in spaced-apart relationship from said emitter region, and a collector electrode disposed on said collector region; and bias means for applying a first bias potential between said emitter region and said base electrode and a second bias potential between said emitter region and said collector electrode to inject carriers from said emitter region into said base region; and wherein said transistor structure unit is configurated in relation to the bias potentials developed by said bias means such that the time quantity $d^2/D$, wherein $d$ represents the distance between the emitter and collector regions as measured along the thickness direction of said transistor structure unit, and $D$ represents the diffusion coefficient of minority carriers in the base region and the time quantity $l^2/\mu V_{EB}$, wherein $l$ represents the distance between the emitter region and the region of said base region on which said base electrode is disposed, $\mu$ represents the carrier mobility of minority carriers in the base region, and $V_{EB}$ represents the voltage applied across said emitter region and base electrode are substantially equal to each other and less than the recombination lifetime in said base region of carriers injected from said emitter region into said base region so that the flow of carriers through said base region toward said collector region varies in coefficient of transportation in accordance with the direction of an applied magnetic field to accordingly vary the number of carriers that reach said base electrode.

2. A magnetic-to-electric conversion semiconductor device as claimed in claim 1; including a semiconductor substrate having first and second main surfaces lying in opposed substantially parallel relationship to one another, said collector region defining said first main surface, said base region defining at least almost the entire surface of said second main surface, means connecting said collector electrode to said collector region on said first main surface in an ohmic contact relationship, said emitter region and said base electrode being disposed on said second main surface, and means connecting said base electrode in ohmic contact relationship to said base region.

3. A magnetic-to-electric conversion semiconductor device as claimed in claim 1; further comprising a plurality of transistor structure units all having a common collector region and having independent base regions, emitter regions, and base electrodes and wherein said bias means comprises means for supplying a bias potential between said emitter region and said base electrode of the respective units and between said emitter region and said collector electrode of the respective units.

4. A magnetic-to-electric conversion semiconductor device as claimed in claim 2; wherein said device is orientated so that the applied magnetic field is substantially parallel to each of said main surfaces and has a component intersecting at substantially right angles with a line along which said emitter region and said base electrode oppose to each other.

5. A magnetic-to-electric conversion semiconductor device as claimed in claim 2; wherein said emitter region includes a region of the first semiconductivity type inserted from said second main surface into said base region.

6. A magnetic-to-electric conversion semiconductor device as claimed in claim 2; wherein said base region is provided at that side of the second main surface with an auxiliary region of the second semiconductivity type including a high concentration impurity, and said base electrode is junctioned to said auxiliary region.

7. A magnetic-to-electric conversion semiconductor device as claimed in claim 2; wherein said base electrode is provided with a signal output terminal.

8. A magnetic-to-electric conversion semiconductor device as claimed in claim 2; wherein said collector electrode is provided with a signal output terminal.

9. A magnetic-to-electric conversion semiconductor device comprising a plurality of transistor structure units including a common collector region of a first semiconductivity type, independent base regions of a second semiconductivity type inset in said collector region to form PN junctions therebetween, independent emitter regions each disposed on one of said base regions to form a PN junction therebetween for injecting carriers into each base region, base electrodes each disposed on one of said base regions in spaced-apart relationship from each of said emitter regions, and a collector electrode disposed on said collector region; and bias means for applying a bias potential between said emitter region and said base electrode of the respective units and a bias potential between said emitter region and said collector electrode of the respective units to inject carriers from said emitter region into said base region of the respective units; and wherein each of said transistor structure units is configured in relation to the bias potentials developed by said bias means such that the time quantity $d^2/D$, wherein $d$ represents the distance between the emitter and collector regions as measured along the thickness direction of said transistor structure unit, and $D$ represents the diffusion coefficient of minority carriers in the base region is substantially equal to the time quantity $l^2/\mu V_{EB}$, wherein $l$ represents the distance between the emitter region and the region of said base region on which said base electrode is disposed, $\mu$ represents the carrier mobility of minority carriers in the base region, and $V_{EB}$ represents the voltage applied across said emitter region and base electrode so that the flow of carriers through said base region toward said collector region varies in coefficient of transportation in accordance with the direction of an applied magnetic field to accordingly vary the number of carriers that reach said base electrode.

10. A magnetic-to-electric conversion semiconductor device as claimed in claim 9, including means connecting said two units in such a relationship that an electrical potential on a common signal output terminal is variable.

11. A magnetic-to-electric conversion semiconductor device as claimed in claim 9, wherein recombination lifetime in said base region of carriers injected from said emitter region into said base region is greater than both of said transit times.

12. A magnetic-to-electric semiconductor transducer device comprising: a semiconductor body having a collector region of a first conductivity type, a base region of a second conductivity type inset in and contiguous with a portion of said collector region, and an emitter region of said first conductivity type contiguous with a portion of said base region and separated from said collector region by said base region; a base electrode ohmically connected to said base region; a collector electrode ohmically connected to said collector region; biasing means for forwardly biasing the emitter-base junction and reversely biasing the collector-base junction during use of the device to inject charge carriers from said emitter region into said base region afterwhich some of the charge carriers flow through said base region to said base electrode and others flow through said base region across said collector-base junction and then through said collector region to said collector electrode; wherein said semiconductor body is configured in relation to the output of said biasing means such that said base electrode is spaced apart from said emitter region a distance suitably selected in relation to the dimensions of said semiconductor body so that the time quantity $d^2/D$, wherein $d$ represents the distance between the emitter and collector regions as measured along the thickness direction of said transistor structure unit, and $D$ represents the diffusion coefficient of minority carriers in the base region and the time quantity $l^2/\mu V_{EB}$, wherein $l$ represents the distance between the emitter region and the region of said base region on which said base electrode is disposed, $\mu$ represents the carrier mobility of minority carriers in the base region, and $V_{EB}$ represents the voltage applied across said emitter region and base electrode are substantially equal to each other and less than the recombination lifetime in said base region of charge carriers injected from said emitter region into said base region so that the coefficient of transportation of the charge carriers flowing to said collector region varies in accordance with the strength of a magnetic field applied to said semiconductor body to accordingly vary the number of charge carriers flowing to said base electrode; and means responsive to the number of charge carriers reaching said base and collector electrodes for providing an electrical signal representative of the strength of the applied magnetic field.

13. A magnetic-to-electric semiconductor transducer device according to claim 12; wherein said semiconductor body includes an auxiliary region interposed between said base region and said base electrode and having said second conductivity type including therein a high concentration impurity.

14. A magnetic-to-electric semiconductor transducer device according to claim 12; wherein said collector region has a recess therein, and wherein said base region lies within said recess and is contiguous with said collector region at all surfaces thereof except for one exposed surface, and wherein both said emitter region and said base electrode are contiguous with said exposed surface.

* * * * *